United States Patent [19]

Tanimoto et al.

[11] 4,146,902
[45] Mar. 27, 1979

[54] IRREVERSIBLE SEMICONDUCTOR SWITCHING ELEMENT AND SEMICONDUCTOR MEMORY DEVICE UTILIZING THE SAME

[75] Inventors: Masafumi Tanimoto, Mitaka; Takashi Watanabe, Tokorozawa; Nobuaki Ieda; Junichi Murota, both of Kodaira, all of Japan

[73] Assignee: Nippon Telegraph and Telephone Public Corp., Japan

[21] Appl. No.: 917,260

[22] Filed: Jun. 20, 1978

Related U.S. Application Data

[63] Continuation of Ser. No. 746,585, Dec. 1, 1976, abandoned.

[30] Foreign Application Priority Data

Dec. 3, 1975 [JP] Japan .................................. 50-142866

[51] Int. Cl.² .......................................... H01L 49/02
[52] U.S. Cl. ............................................. 357/6; 357/23; 357/41; 357/51; 357/59
[58] Field of Search ................... 357/6, 41, 51, 59, 23

[56] References Cited

U.S. PATENT DOCUMENTS

| 3,792,319 | 2/1974 | Tsang | 357/59 |
| 3,889,358 | 6/1975 | Bierhenke | 357/41 |
| 4,001,762 | 1/1977 | Aoki et al. | 357/59 |

Primary Examiner—Edward J. Wojciechowicz
Attorney, Agent, or Firm—Charles W. Helzer

[57] ABSTRACT

A semiconductor switching element comprised by a high resistivity polycrystalline silicon resistor whose resistance irreversibly decreases to a small value at a threshold voltage upon the voltage across the resistor reaching the threshold voltage. A semiconductor memory device is constituted by using the switching element as a memory cell and a semiconductor gate element for controlling the current flowing through the semiconductor switching element.

17 Claims, 15 Drawing Figures

TO A SOURCE OF CONSTANT VOLTAGE

IRREVERSIBLE SEMICONDUCTOR SWITCHING ELEMENT AND SEMICONDUCTOR MEMORY DEVICE UTILIZING THE SAME

This is a continuation of application Ser. No. 746,585, filed Dec. 1, 1976, now abandoned.

BACKGROUND OF THE INVENTION

This invention relates to an irreversible semiconductor switching element and a semiconductor memory device utilizing the same.

For use as a semiconductor switching element, many types of semiconductor elements such as a diode utilizing a PN junction, a transistor utilizing a PNP or NPN junction, a MOS transistor or thyristor have been developed. In each of these known semiconductor switching elements, the state of the element is changed reversibly by changing such parameters as the internal conditions or the external conditions of the element so that when the switching state of the element is specified at a certain state, it is necessary to adjust the bias in order to set the specific state. For the purpose of solving this problem it has been proposed to predetermine the relative connection of the component elements at the time of assembling the same such that as if the switching element were arranged to adjust the bias. According to this method, however, it is necessary to forecast the state of the location at which the switching element is to be located at the time of designing. Such method requires a complicated design. Further, when such circuit is incorporated into an integrated circuit it is necessary to design the circuit to meet the requirement of the user thereby increasing the cost of the integrated circuit and the cost of apparatus utilizing the same. A typical example of the electronic apparatus utilizing such semiconductor switching element is a read only memory device (ROM). Although various types of ROM are not available, socalled PROM, that is read only memories that can be written are generally used. More particularly, typical PROMs include a fusible-link PROM, a blown junction type PROM and a nonvolatile MOS PROM etc.

In the fusible link PROM, a fuse made of aluminum, a nickelchromium alloy or polycrystalline silicon is incorporated into each memory cell of an IC ROM and writing is performed by passing current through the fuse of a specific memory cell selected according to a condition desired by a user and blowing the fuse. In the blown junction type PROM the fuse is replaced by a diode, and writing is performed by destroying the diode characteristics by passing large current through the diode. With PROMs of this type it is necessary to pass large current of the order of from 30 to 200 mA to write. But this is not desirable because the ROM is constituted by an integrated circuit. Especially, in the former type, the blown fuse spatters so that it is necessary to provide a cover for the fuse or to limit the rise-time of the blowing current for the purpose of preventing spattering of the blown fuse.

In the nonvolatile MOS PROM a modified construction of a MOS type field effect transistor is used in which electric charge is injected into the trap center of an insulator by tunnel effect or electric charge is injected into a floating gate by tunnel effect or avalanche effect thereby storing a binary "0" or "1" according to the change in the state of the charge.

However, in these types of the PROMs the voltage for writing is relatively high of the order of 50 volts. Decrease of the write voltage is difficult due to the construction of the PROM.

SUMMARY OF THE INVENTION

Accordingly, it is an object of this invention to provide a novel semiconductor switching element.

Another object of this invention is to provide a novel irreversible semiconductor switching element capable of switching at low voltage and low current.

Still another object of this invention is to provide a novel irreversible semiconductor switching element having extremely simple construction.

A further object of this invention is to provide a semiconductor switching element capable of being manufactured with known fabricating processes for LSI.

Still further object of this invention is to provide a novel read only semiconductor memory device capable of writing with low voltage and low current by using said novel semiconductor switching element.

According to one aspect of this invention there is provided a semiconductor switching element having an irreversible characteristic comprising a high resistivity polycrystalline silicon resistor and terminal electrode means for applying voltage across the silicon resistor whereby the switching operation is performed by utilizing the fact that the resistance of the silicon resistor varies irreversibly depending upon the magnitude of the applied voltage.

According to another aspect of this invention there is provided a semiconductor memory device including a memory cell comprising a semiconductor switching element constituted by a high resistivity polycrystalline silicon resistor and terminal electrode means for applying voltage across the silicon resistor, the switching element operating by utilizing, the fact that the resistance of the silicon resistor is varied in accordance with the magnitude of the applied voltage, and a semiconductor gate element for controlling the current flowing through the switching element.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENTS

Figures 1, 2:
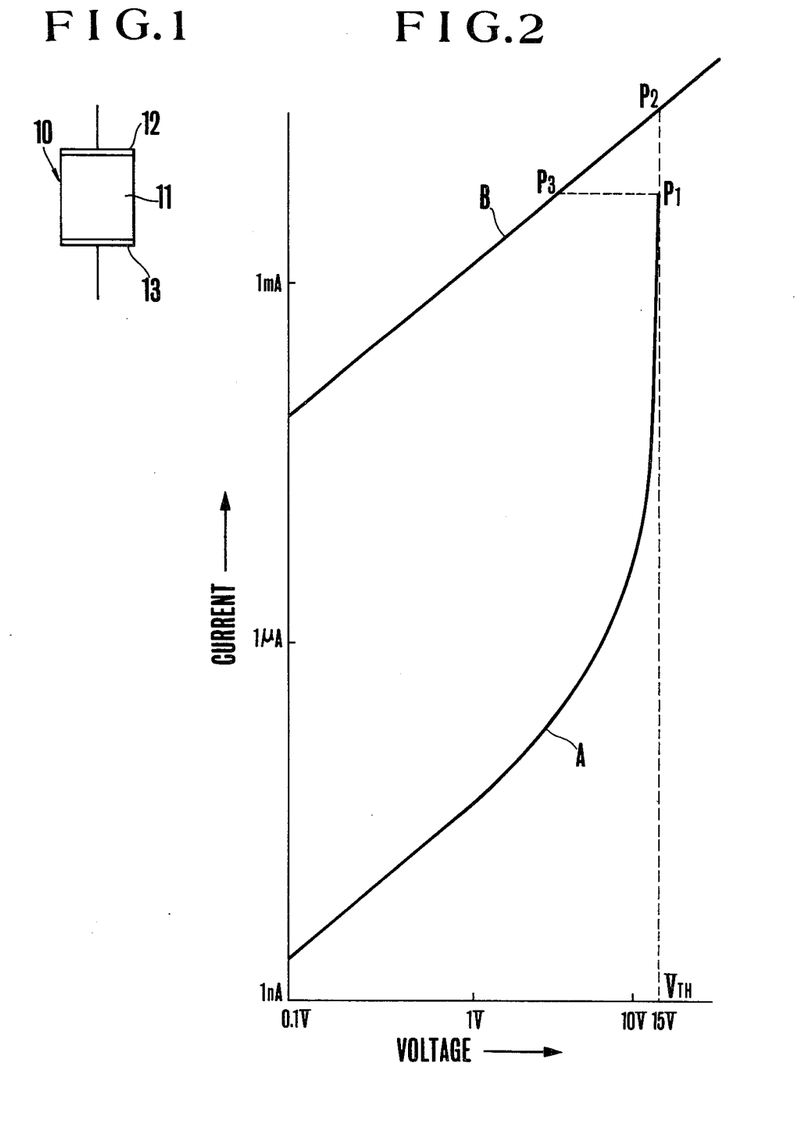
FIG. 1 is a diagrammatic representation showing the basic construction of the irreversible semiconductor switching element of this invention.
FIG. 2 is a graph showing the current-voltage characteristics of the switching element shown in FIG. 1.

A semiconductor switching element 10 diagrammatically shown in FIG. 1 comprises a high resistivity polycrystalline silicon resistor 11 and terminal electrodes 12 and 13 made of metal or conductive semiconductor and bonded to the opposite sides of resistor 11. Resistor 11 has a resistivity of higher than $10^4$ hom-cm, for example. The impurity dopant in the resistor may be either of the P type or N type and the impurity may be doped at the time of growing the polycrystalline silicon or by heat diffusion, or ion implantation technique. However, the concentration of the impurity doped is extremely small.

The operating characteristics of the semiconductor switching element 10 having a construction as shown in FIG. 1 are as follows. FIG. 2 shows the current-voltage characteristic of the element wherein the abscissa represents the voltage and the ordinate the current. This characteristic was obtained for a high resistivity polycrystalline silicon resistor 11 having a resistivity of $10^7$ ohm-cm, the distance between the electrodes (the thickness of the polycrystalline resistor) of 0.6 micron, and the electrode area of 3600 square microns.

As can be clearly noted from FIG. 2, as the voltage is increased gradually, the current through the switching elements 10 increases in proportion to the voltage in a low voltage range. However, when the voltage exceeds a predetermined value (about 3V, in this example) the rate of current increase becomes quite rapid (or becomes nonlinear). As the voltage is increased further, the value of the current moves to point $P_2$ on the characteristic B from point $P_1$ on the characteristic A due to rapid decrease of the resistance of resistor 11 at an applied voltage of about 15V. Thereafter, with the increase in the applied voltage, current increases linearly according to the characteristic B.

Conversely, when the voltage is gradually decreased from this state, current decreases according to the characteristic B and even when the point $P_2$ is passed the variation of the current does not follow the characteristic A but follows the characteristic B whereby the current decreases in proportion to the applied voltage.

More particularly, once transferred to the high conductive state from the low conductive state, the high resistance polycrystalline silicon resistor comprising the semiconductor switching element of this invention preserves the high conductive state, thus performing the desired permanent switching operation. It was confirmed that, with this example a current variation of about $10^4$ times is possible by this switching operation.

On the contrary, when the current flowing through the semiconductor switching element 10 is gradually increased, in a low current range, the terminal voltage varies according to characteristic A but when the value of the current reaches about 10m A, the resistance of the polycrystalline silicon resistor 11 decreases and the value of the voltage moves to point $P_3$ on characteristic B from point $P_1$ on characteristic A. Thereafter, the terminal voltage varies along characteristic B with the increase in the current flowing through the semiconductor switching element. And when the value of the current is decreased, the terminal voltage varies only along characteristic B and never along characteristic A.

Figure 3:
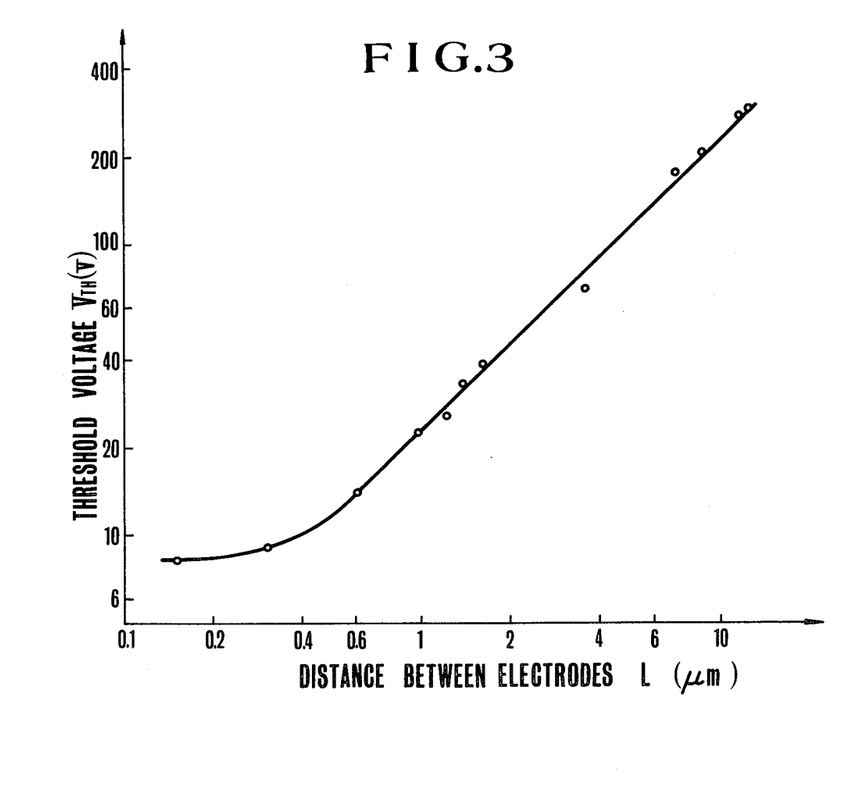
FIG. 3 is a graph showing the threshold voltage-distance between the electrodes characteristic of the switching element shown in FIG. 1.

In the semiconductor switching element, the voltage at which the high resistivity polycrystalline silicon resistor transfers from the low conductive state to the high conductive state is termed the threshold voltage ($V_{TH}$). The threshold voltage varies with the distance between the electrodes of the element as shown in FIG. 3. As can be noted from FIG. 3, the threshold voltage increases substantially in proportion to the distance between the electrodes. However, when the distance L between the electrodes, that is the thickness of the polycrystalline silicon resistor decreases below 0.3 micron, the threshold voltage becomes substantially constant. Its value is about 8V. Based on this characteristic, it is possible to select any threshold voltage $V_{TH}$ by varying the thickness of the polycrystalline silicon resistor. However, it will be noted that above a thickness of about one (1) micrometer the threshold voltage will exceed 25 volts. Accordingly, in order to employ low value writing voltages with the memory of the invention, i.e. 25 to 8 volts, the thickness of the polycrystalline silicon layer should be of the order of one (1) micrometer.

Figure 4:
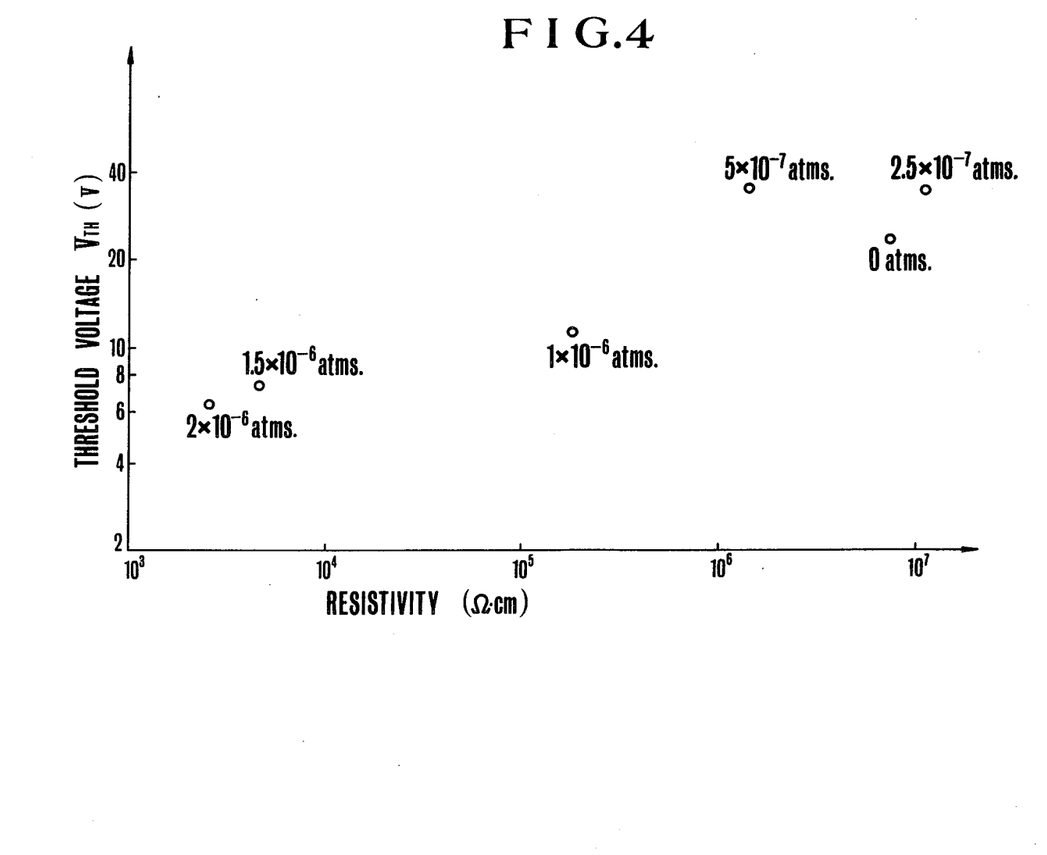
FIG. 4 is a graph the threshold voltage-resistivity characteristic of the switching element shown in FIG. 1.

The relationship between the resistivity of the high resistivity polycrystalline silicon resistor 11 comprising the semiconductor switching element 10 and the threshold voltage is shown in FIG. 4. The resistivity of the resistor can be varied by varying the concentration of doped arsenic which is effected by varying the partial pressure of arsine ($AsH_3$) which is used in the growth of the polycrystalline silicon. In one example, the temperature of growth is 700° C. and the film thickness is about 1.0 micron. In FIG. 4, the abscissa represents the resistivity, the ordinate the threshold voltage, and the numerical data near measuring points shows the partial pressure of arsine gas.

From FIG. 4 it can be understood that there is a tendency that the threshold voltage generally increases with increasing resistivity.

Figure 5:
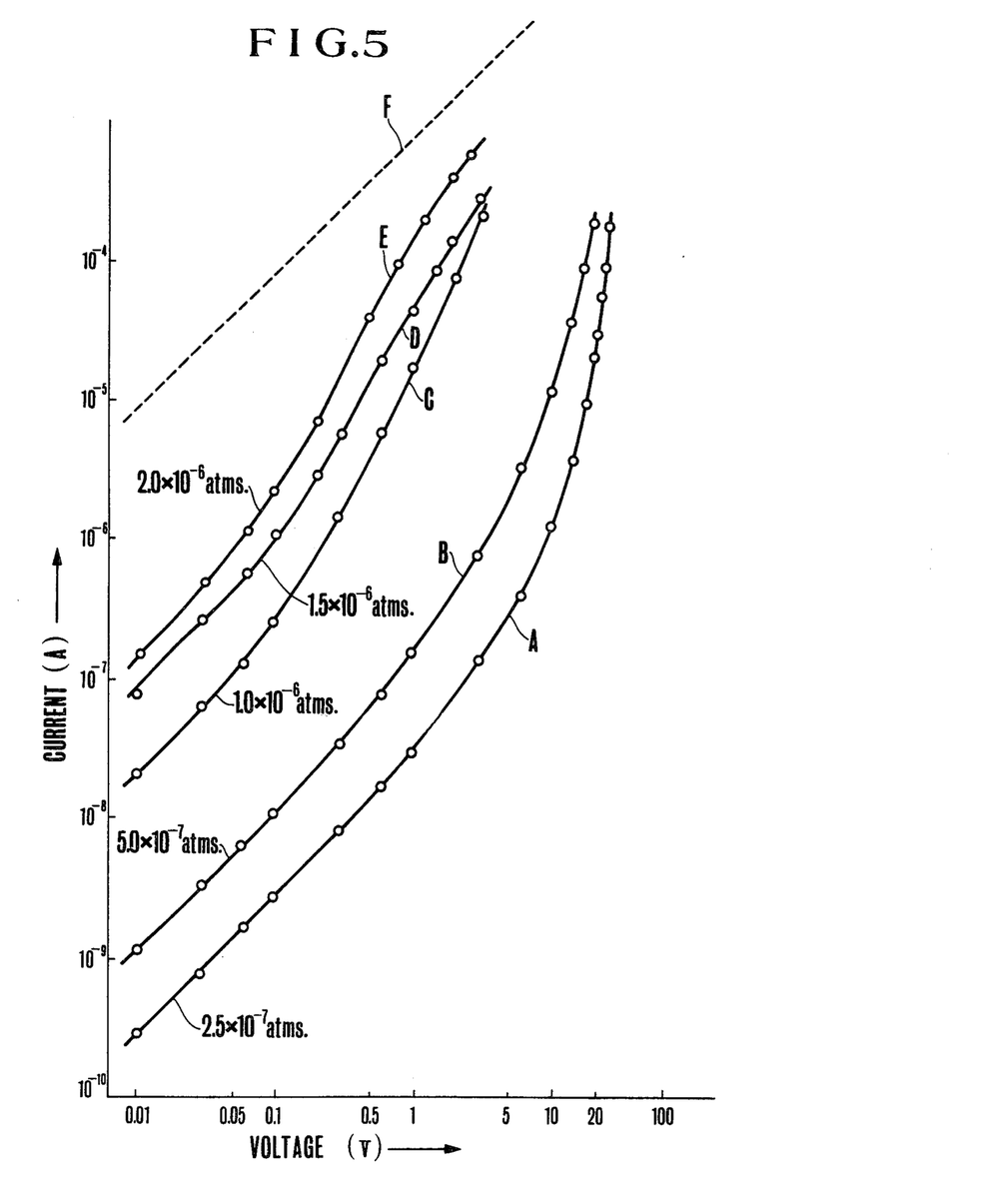
FIG. 5 is a graph showing the current-voltage characteristics of the switching element shown in FIG. 1 which resulted from differences in of resistivity of the element by varying the partial pressure of gas employed in its fabrication.

When polycrystalline silicon resistors having different resistivities as shown in FIG. 4 are used the current-voltage characteristics thereof vary as shown in FIG. 5 in which the abscissa represents the voltage whereas the ordinate the current. Characteristics A-E were obtained for polycrystalline silicon resistors 11 grown at a temperature of 700° C. having a film thickness of about 1.0 micron and different impurity concentrations. The numerical data for respective characteristics show the partial pressures of the arsine gas utilized at the growth of the polycrystalline silicon which are the measure of the concentration of arsenic. The dotted line F on the upper portion of FIG. 5 shows a current-voltage characteristic of a polycrystalline silicon resistor which has changed to the low resistance state by the application of a voltage higher than the threshold value.

These characteristic curves show that as the impurity concentration of the polycrystalline silicon resistor at the high resistance state decreases, the current flowing through the polycrystalline silicon resistor decreases and the threshold voltage decreases. Even when the resistance value under the high resistance state is different while a voltage higher than the threshold value is applied across the resistor, after exceeding the threshold value its characteristic is the same as shown by curve F.

Figure 6:
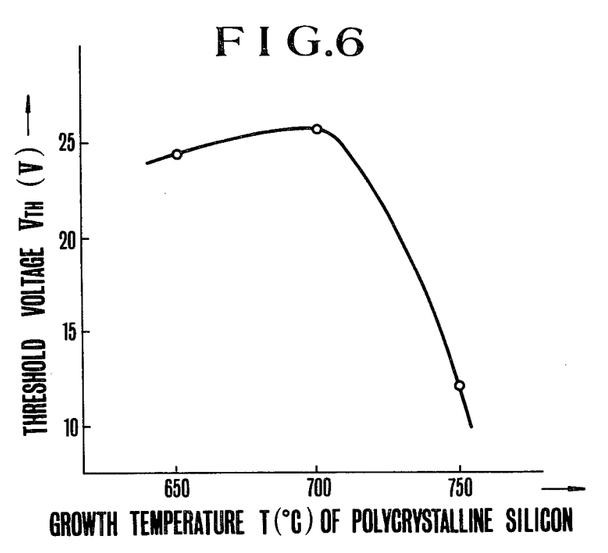
FIG. 6 is a graph showing the threshold voltage-polycrystalline silicon growth temperature characteristic of the switching element shown in FIG. 1.

FIG. 6 is a graph showing the relationship between the growth temperature of the polycrystalline silicon (abscissa) and the threshold voltage (ordinate) of the high resistivity polycrystalline silicon resistor 11 comprising the semiconductor switching element of this invention. The polycrystalline silicon is not doped with any impurity and has a thickness of about 1.2 microns.

From this characteristic it can be understood that the threshold voltage $V_{TH}$ of the high resistivity polycrystalline resistor 11 varies also in accordance with the growth temperature T in addition to the distance between the electrodes and the resistivity as has been described hereinabove.

As has been discussed hereinabove the threshold voltage of the semiconductor switching element of this invention can be varied to any value by varying the distance between the electrodes, resistivity of the polycrystalline silicon and the growth temperature of the polycrystalline silicon. For example, the switching can be operated with an applied voltage of 15V and a current of 10m A, which are considerably smaller than the voltage and current of the prior art semiconductor switching elements. For this reason, the semiconductor switching element of this invention can readily be incorporated into large integrated circuits as well as modern MOS LSI.

Figure 7:
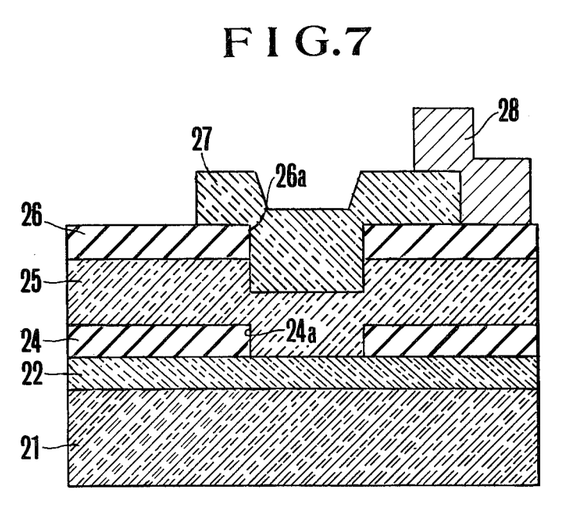
FIG. 7 is a sectional view of the switching element such as shown in FIG. 1 manufactured with planar technique.

FIG. 7 shows a semiconductor switching element of this invention fabricated by planar technique and comprising a semiconductor substrate 21 and a layer of polycrystalline silicon 22 heavily doped with arsenic. This polycrystalline silicon layer 22 corresponds to the electrode 13 shown in FIG. 1 and overlaid by a $SiO_2$ layer 24. A undoped high resistivity polycrystalline silicon layer 25 overlies the $SiO_2$ layer 24 and has an overlying $SiO_2$ layer 26. A portion of the layer 25 is connected with the polycrystalline silicon layer 22 through an opening 24a formed through the $SiO_2$ layer 24. A polycrystalline silicon layer 27 heavily doped with arsenic overlies the $SiO_2$ layer 26 and is connected to layer 25 through an opening 26a formed through the $SiO_2$ layer 26. A wiring layer 28 is formed on the polycrystalline silicon layer 27 for connecting the same to other circuit components. The polycrystalline silicon layer 27 corresponds to the electrode 12 shown in FIG. 1.

Although in this embodiment, the polycrystalline layers 27 and 22 are aligned in the vertical direction, they may be displaced in the lateral direction by laterally displacing the relative position of the openings 24a and 26a of the $SiO_2$ layers 24 and 26 respectively.

It was confirmed that various characteristics shown in FIGS. 2 through 6 can also be provided by the embodiment shown in FIG. 7.

The semiconductor switching element shown in FIG. 7 can be fabricated by the method as described hereunder. At first, a N type semiconductor substrate 21 having a resistivity of about 2 ohm-cm is prepared. Then a polycrystalline silicon layer 22 heavily doped with arsenic is deposited on the substrate by the pyrolysis of a mixture of $SiH_4$, $H_2$ and $AsH_3$ at 750° C. The partial pressure of $AsH_3$ at this time is $4.5 \times 10^{-3}$ atmospheric pressure. The resulting layer 22 has a thickness of 0.45 micron. Then a $SiO_2$ layer 24 is formed by chemical vapour deposition method to a thickness of 0.5 micron at a temperature of 440° C. Opening 24a is formed at a predetermined position by a well known method. Then, a layer of undoped polycrystalline silicon layer 25 is deposited by the pyrolysis of a mixture of $SiH_4$ and $H_2$ at a temperature of 700° C. to a thickness of 0.6 micron. Then, $SiO_2$ layer 26 is deposited by chemical vapour deposition method at a temperature of 440° C. to a thickness of 0.5 micron. The atmosphere utilized at this time comprises a mixture of $SiH_4$ and oxygen. Opening 26a is formed through the layer 26 at a predetermined position by a well known method. Finally, a polycrystalline silicon layer 27 heavily doped with arsenic is deposited at a temperature of 700° C. to cover opening 26a and the portion of the $SiO_2$ layer 26 surrounding the same by the pyrolysis of a mixture of $SiH_4$, $H_2$ and $AsH_3$. The resulting layer has a thickness of 0.45 micron. In the foregoing steps, masks are of course used as is well known in the art.

It can be understood that a semiconductor switching element having the construction described above can be fabricated by the same steps of fabricating an integrated circuit.

The semiconductor switching element 10 constituted by the high resistivity polycrystalline silicon resistor 11 having the characteristics described above is especially suitable to use as a memory element.

Figure 8:
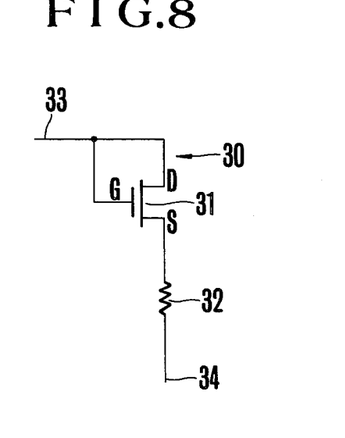
FIG. 8 shows a fundamental connection diagram of a memory cell of a semiconductor memory device utilizing the semiconductor switching element embodying the invention.

FIG. 8 shows a basic circuit of a memory cell 30 of a semiconductor memory element utilizing the novel switching element of this invention. The memory cell comprises a field effect transistor 31 and a switching element 32 constituted by the high resistivity polycrystalline silicon resistor which is connected in series with the source and drain electrodes of the field effect transistor 31. The drain electrode of the field effect transistor 31 is connected to a word line 33 together with the gate electrode, and one terminal of the switching element 32 is connected to a digit line 34.

To write a binary information "1" into the memory cell 30, a positive voltage, for example, is applied to the word line 33 and the digit line 34 is applied with ground potential. The value of the voltage applied to the word line 33 is selected such that a voltage, for example 15V, higher than the threshold voltage, is applied to the semiconductor switching element 32. Then, the field effect transistor 31 becomes conductive to apply a voltage higher than threshold voltage $V_{TH}$ across the semiconductor switching element 32 thus changing its state from high resistance to low resistance. Thus, its operation transfers from characteristic A to characteristic B shown in FIG. 2. In other words, the binary information "1" is irreversibly written into the memory cell, where the write voltage is 15V, for example, the write current is about 10mA.

To read the information stored in the memory cell 30 positive voltage is applied to the word line 33 and the ground potential to the digit line 34. The voltage applied to the word line 33 at this time is selected such that a voltage lower than the write voltage described above is applied across the switching element 32, the selected voltage being 5V, for example. Since the operation of the semiconductor switching element 32 has been transferred to characteristic B from characteristic A shown in FIG. 2, a current about $10^4$ times of the initial current, that is about 10mA will flow through the switching element.

To write a binary information "0" into the memory cell 30, different from the binary information "1" a voltage lower than the threshold voltage $V_{TH}$ will be applied across the semiconductor switching element 32, so that the initial state will be preserved. Consequently, when binary information thus stored by controlling the state of the switching element 32 is read out from the memory cell it is easy to discriminate the two different states present in the read out information because the ratio of the current values is about $1:10^4$.

Figure 9:
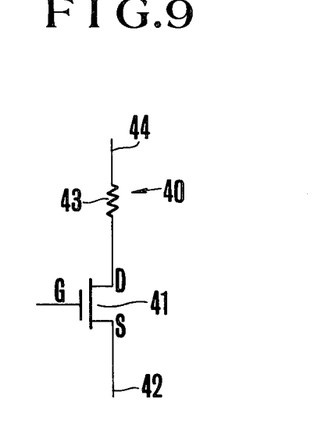
FIGS. 9 and 10 are connection diagrams of modified memory cells.
Figure 10:
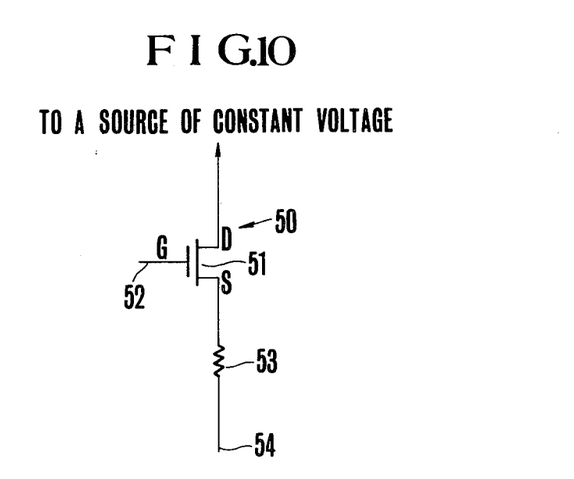

FIGS. 9 and 10 show modifications of the memory cell 30 shown in FIG. 8. In the modified memory cell 40 shown in FIG. 9, the source electrode of a field effect transistor 41 is connected to a digit line 42 while the drain electrode is connected to a word line 44 through the semiconductor switching element 43 of this invention.

To write a binary information "1" into the memory cell 40, a voltage is applied across the word line 44 and the digit line 42 and a suitable voltage is impressed upon the gate electrode of the field effect transistor 41 to turn it on. In the same manner as above described, when a voltage higher than the threshold voltage $V_{TH}$ is applied across the semiconductor switching element 43, the resistance value thereof decreases irreversibly thus writing the binary information "1" into the memory cell 40.

To detect the information written in this manner, a voltage lower than the information writing voltage is applied across the word line 44 and the digit line 42 and a suitable voltage is impressed upon the gate electrode of the field effect transistor 41 thus turning it on. The information can be judged by the magnitude of the current flowing through the digit line 42.

In the memory cell 50 shown in FIG. 10, the gate electrode of a field effect transistor 51 is connected to a word line 52, the drain electrode is connected to a source of constant voltage, not shown, and the source electrode is connected to a digit line 54 via a semiconductor switching element 53 of this invention.

To write a binary information "1" into the memory cell 50, a voltage sufficient to turn on the field effect transistor 51 is applied to the word line 52 with the result that a voltage higher than the threshold voltage $V_{TH}$ is applied across the semiconductor switching element 53 thereby irreversibly decreasing the resistance value thereof. To read out the information a voltage lower than the write voltage is applied to the word line 52, and the current flowing through the digit line 54 is read.

Figure 11:
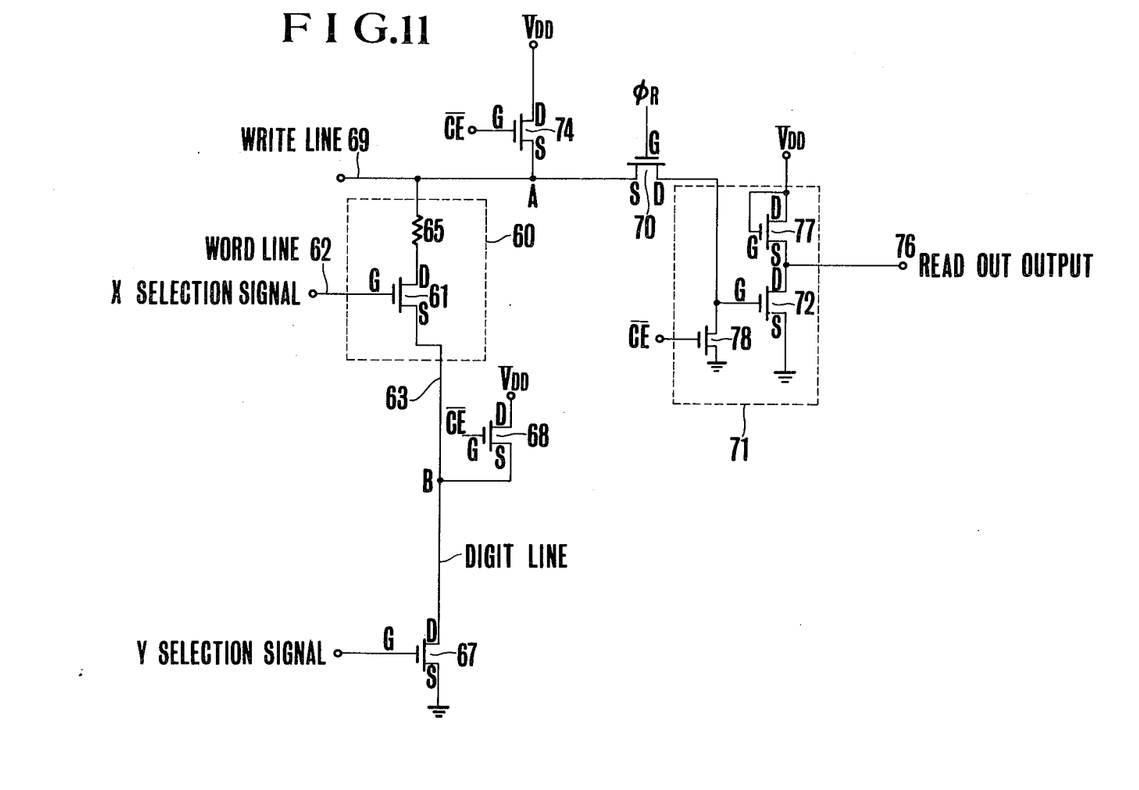
FIG. 11 is a connection diagram showing a modified memory cell and peripheral circuits for reading.
Figure 12:
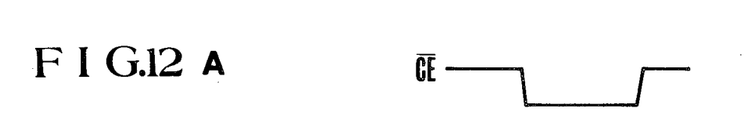
FIGS. 12A, 12B and 12C are waveforms useful to explain the operation of the circuit in FIG. 11

FIG. 11 shows a further modification of the memory cell and the peripheral circuits for driving the same. In this modification the gate electrode of a field effect transistor 61 comprising the memory cell 60 is connected to a word line 62, the source electrode to a digit line 63 and the drain electrode to one terminal of the semiconductor switching element 65 embodying the invention. The source electrode of the field effect transistor 61 is connected through digit line 63 to the drain electrode of a Y selection field effect transistor 67. The source electrode of the transistor 67 is grounded, and the gate electrode thereof is supplied with a Y selection signal at a timing as shown in FIG. 12B. The digit line 63 is also connected to the source electrode of a precharging field effect transistor 68, whose drain electrode is connected to a source $V_{DD}$. The gate electrode of the transistor 68 is supplied with a precharging signal $\overline{CE}$ at a timing as shown in FIG. 12A. The gate electrode of the field effect transistor 61 of the memory cell 60 is supplied with a X selection signal as shown in FIG. 12B through the word line 62. One terminal of the semiconductor switching element 65 of the memory cell 60 is connected to a write line 69 which in turn is connected to the gate electrode of a field effect transistor 72 which comprises part of a read inverter 71. Write line 69 is connected via the drain and source electrodes of a gating field effect transistor 70, having the gate electrode thereof connected to receive a clock signal $\phi R$ having a timing as shown in FIG. 12C. The said terminal of the semiconductor switching element 65 also is connected to the source electrode of a precharging field effect transistor 74, having the drain electrode thereof connected to a source voltage $V_{DD}$ and the gate electrode thereof supplied with a precharge signal $\overline{CE}$.

The source electrode of the field effect transistor 72 comprising the read inverter 71 is grounded and the drain electrode is connected to an output terminal 76 and to the source electrode of a field effect transistor 77. The drain and gate electrodes of the field effect transistor 77 are commonly connected to a source voltage $V_{DD}$. The gate electrode of the field effect transistor 72 also is connected with the drain electrode of a field effect transistor 78 having a source electrode grounded and a gate electrode supplied with the precharge signal $\overline{CE}$ shown in FIG. 12A. The purpose of the field effect transistor 78 is to discharge the charge stored at the gate electrode of the transistor 72 for setting the initial gate voltage when the field effect transistor 70 is OFF. In an actual semiconductor memory device a plurality of memory cells are arranged in a matrix to establish the connection shown in FIG. 11.

To write information into the semiconductor memory device shown in FIG. 11, the gate electrodes of the field effect transistors 68, 70, 74 and 78 are maintained at the ground potential, and X and Y selection signals are applied to the field effect transistor 61 of a memory cell 60 and the field effect transistor 67. Under these conditions, a write signal is applied to the write line 69 having a magnitude sufficient to apply a voltage higher than the threshold voltage $V_{TH}$ across the switching element 65. Accordingly, the switching element transfers to the low resistance state from the high resistance state thus writing the information.

Reading operation is performed in the following manner. A precharging signal $\overline{CE}$ is applied to turn on field effect transistors 68 and 74 thus precharging nodes A and B. Under these conditions X and Y selection signals are applied to the field effect transistor 61 of the memory cell 60 and the field effect transistor 67 to select the same. Consequently, the source electrode of the transistor 61 will be grounded. Then, the charge stored in node A is discharged to the ground through the semiconductor switching element 65 of the memory cell 60 with a time constant determined by the product RC of the resistance of the semiconductor switching element 65 and the stray capacitance of the circuit.

Where the memory cell has been written with a binary information "1" the resistance of the smiconductor switching element 65 has been decreased so that the potential of the node A decreases with a smaller time constant than the case wherein a binary information "0" is stored. Accordingly, the information stored in the memory cell 60 may be read out from the output terminal 76 of the inverter 71, the binary read out information "1" and "0" being discriminated by the difference between the risetimes required to build up to a high potential from the ground potential, the discrimination being performed by a circuit described later. Such discrimination of the risetimes of the voltages appearing at the output terminal 76 can be made readily because the resistance of the high resistance polycrystalline silicon resistor comprising the semiconductor switching element varies at a ratio of 1:10$^4$ before and after the irreversible resistance variation. The gate transistor 70 acts as a switching element for isolating the memory cell from the read out system for the purpose of preparing for the next read out operation after supplying a read signal to the inverter 72 and to latch the input voltage applied to the gate electrode of the field effect transistor 72.

Figure 13:
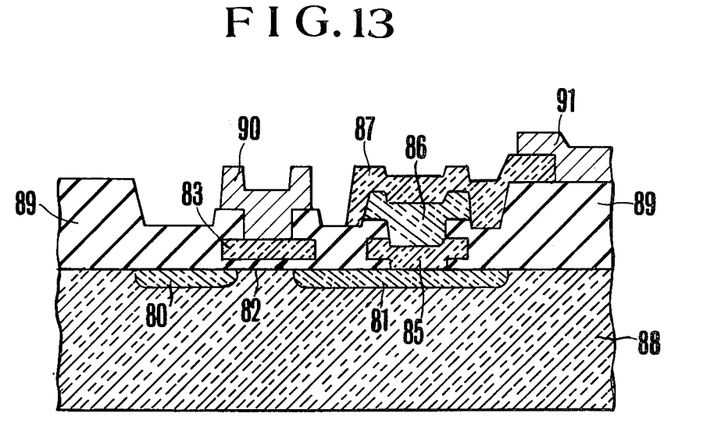
FIG. 13 is a longitudinal sectional view of one example of the physical construction of the memory cell shown in FIG. 11.

FIG. 13 shows one example of the construction of the memory cell shown in FIG. 11, which is especially suitable for use in a semiconductor integrated circuit. In FIG. 13, a source diffusion region 80, a drain diffusion region 81, a channel region 82 interconnecting the regions 80 and 81 and a gate region 83 made up of polycrystalline silicon heavily doped with arsenic are the regions that constitute the field effect transistor 61 of the memory cell 60. Overlying the drain diffusion region 81 is a polycrystalline silicon region 85 heavily doped with arsenic and acting as the drain electrode of the field effect transistor and one terminal of the semiconductor switching element 65, and a high resistance polycrystalline silicon region 86 of this invention is formed to cover the region 85. Overlying the polycrystalline silicon region 86 is a polycrystalline silicon region 87 heavily doped with arsenic and acting as the terminal of the semiconductor switching element 65. The memory cell further comprises a semiconductor substrate 88, an insulating layer 89 of SiO$_2$, wiring layers 90 and 91 made of aluminum or other conductive metals or low resistance semiconductors. With this construction, since it is possible to arrange the semiconductor switching element 65 in vertical alignment with the drain region 81, the space factor above the semiconductor substrate 88 can be improved. Such vertical alignment permits fabrication of these component elements by chemical vapour deposition technique so that the control of the thickness of the high resistivity polycrystalline silicon region is easy. Moreover, as the resistivity of the polycrystalline silicon region 86 is high, the area or volume of the semiconductor switching element 65 can be reduced greatly, thereby contributing to the increase in the bit density of the semiconductor memory device.

The high resistivity polycrystalline silicon region of the semiconductor switching element 65 shown in FIG. 13 can be formed by a chemical vapour deposition method utilizing monosilane atmosphere (which does not dope any impurity at a temperature of 700° C.). A thickness of about 0.6 micron can be obtained with in an interval of about 9 minutes.

As can be noted from the construction shown in FIG. 13, the semiconductor switching element of this invention can be advantageously fabricated by LSI fabrication technique because it utilizes polycrystalline silicon bodies.

It will be clear that the field effect transistors utilized to pass current through the semiconductor switching element made of high resistivity polycrystalline silicon shown in the foregoing embodiments can be replaced by other various semiconductor active elements, for example, bipolar transistors, and thyristors. Further, in the embodiment shown in FIG. 13, the semiconductor switching element has been formed on the drain of the field effect transistor it can also be formed on the insulating film adjacent the transistor or on any suitable portion.

As above described since the semiconductor memory device utilizing the novel semiconductor switching element of this invention is based on the unique utilization of the irreversible resistance polycrystalline silicon as the principal component element, it is not necessary to pass large current of the order of about 30 to 200mA for the purpose of blowing a fuse or destroying a diode junction as in the prior art memory devices utilizing fuses and diodes. According to this invention, it is possible to write informations with a write current of only 10mA or less. The write voltage can be set to any value which is also lower than that of the prior art device. Further different from the fuse type memory device it is not necessary to use any special means for preventing the splash of the blown out fuse.

Although the invention has been shown and described in terms of some preferred embodiments thereof, it will be clear that the invention is by no means limited to these specific embodiments but various changes and modifications will be obvious to one skilled in the art without departing from the true spirit and scope of invention as defined in the appended claims.

What is claimed is:

1. A semiconductor switching element having an irreversible conductivity characteristic comprising a high resistivity thin polycrystalline silicon resistor layer having a resistivity of from 10$^4$ to 10$^7$ ohm-cm and a thickness of from 0.15 to 1 microns and terminal electrode means formed on opposite planar surfaces on said thin silicon resistor layer for applying operating voltage across the thickness of said thin polycrystalline silicon resistor layer and establishing a current path therethrough, the resistance of said thin polycrystalline silicon resistor layer switching irreversibly in a nondestructive manner to a lower value upon the magnitude of an applied operating voltage exceeding a predesigned threshold voltage value of the order from 8 to 25 volts at which the resistance of the resistor layer switches irreversibly to the lower value to thereby provide a manyfold increase of at least an order of magnitude in the current flowing through the thin polycrystalline silicon resistor layer upon the application of a read voltage less than said threshold voltage value across the terminal electrode of the thin polycrystalline silicon resistor layer.

2. The semiconductor switching element according to claim 1 wherein the high resistivity polycrystalline silicon resistor layer is comprised of undoped polycrystalline semiconductor having a thickness of from 0.15 to 1 micrometers and the terminal electrode means is comprised of heavily doped semiconductor layers with the polycrystalline silicon resistor layer and the heavily doped semiconductor terminal electrode layers being separated by SiO$_2$ insulator layers having openings therein through which the undoped polycrystalline silicon resistor layer and heavily doped semiconductor terminal electrode layers contact each other.

3. The semiconductor switching element according to claim 2 wherein the thin high resistivity polycrystalline silicon resistor layer and terminal electrode layers are fabricated by chemical vapour deposition technique and are formed on a common substrate with a semiconductor gate element with which the switching element is used in practice.

4. A semiconductor memory device including a memory cell comprising a semiconductor switching element constituted by a high resistivity polycrystalline silicon resistor according to claim 3, and the semiconductor gate element is connected in series electrical circuit relationship with said switching element for controlling the current flowing through said switching element.

5. The semiconductor memory device according to claim 4 wherein said semiconductor switching element and said semiconductor gate element are incorporated into a semiconductor integrated circuit fabricated by chemical vapour deposition technique, and wherein said semiconductor switching element is formed vertically above an electrode of said semiconductor gate element.

6. The semiconductor switching element according to claim 1 wherein the threshold voltage value of said silicon resistor at which the resistance value of the resistor switches irreversibly, is varied by varying the thickness of the polycrystalline silicon resistor layer.

7. The semiconductor switching element according to claim 1 wherein said threshold voltage value is varied by varying the initial value of the resistivity of said thin polycrystalline silicon resistor layer.

8. The semiconductor switching element according to claim 1 wherein said threshold voltage is varied by varying the growth temperature of the polycrystalline silicon resistor layer while it is being grown by chemical vapour deposition technique.

9. A semiconductor memory device including a memory cell comprising a semiconductor switching element constituted by a high resistivity polycrystalline silicon resistor according to claim 1, and a semiconductor gate element connected in series electrical circuit relationship with said switching element for controlling the current flowing through said switching element.

10. The semiconductor memory device according to claim 9 wherein said semiconductor gate element comprises a field effect transistor.

11. The semiconductor memory device according to claim 9 wherein said semiconductor gate element comprises a three terminal semiconductor element having a gate electrode.

12. The semiconductor memory device according to claim 10 wherein the drain and gate electrodes of said field effect transistor are commonly connected to a word line, while the source electrode of said effect transistor is connected to a digit line through said semiconductor switching element.

13. The semiconductor memory device according to claim 10 wherein the drain electrode of said field effect transistor is connected to a word line through said semiconductor switching element, the source electrode is connected to a digit line and the gate electrode is connected to a timing signal source.

14. The semiconductor memory device according to claim 10 wherein the gate electrode of said field effect transistor is connected to a word line, the drain electrode to a voltage source, and the source electrode to a digit line through said semiconductor switching element.

15. The semiconductor memory device according to claim 10 wherein the gate electrode of said field effect transistor is connected to a word line, the source electrode to a digit line, and the drain electrode to a source of voltage through said semiconductor switching element.

16. The semiconductor memory device according to claim 9 wherein said semiconductor switching element and said semiconductor gate element are incorporated into a semiconductor integrated circuit fabricated by chemical vapour deposition technique and said semiconductor switching element is formed vertically above an electrode of said semiconductor gate element.

17. The semiconductor memory device according to claim 16 wherein the lower terminal electrode means of said semiconductor switching element is formed vertically above an electrode of said semiconductor gate element and the said electrode of the semiconductor gate element and the said lower terminal electrode means are comprised by a common layer.

* * * * *